(12) United States Patent
Phillippe et al.

(10) Patent No.: US 9,362,915 B1
(45) Date of Patent: Jun. 7, 2016

(54) LVDS WITH IDLE STATE

(71) Applicant: FREESCALE SEMICONDUCTOR, INC., Austin, TX (US)

(72) Inventors: Jonathan M. Phillippe, Austin, TX (US); Gilford E. Lubbers, Dripping Springs, TX (US); Chris J. Micielli, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/568,442

(22) Filed: Dec. 12, 2014

(51) Int. Cl.
 H03K 19/017 (2006.01)
 H03K 19/0175 (2006.01)
 H03K 3/012 (2006.01)

(52) U.S. Cl.
 CPC .......... *H03K 19/0175* (2013.01); *H03K 3/012* (2013.01)

(58) Field of Classification Search
 CPC .............. H03K 17/22; H03K 17/6872; H03K 19/017509; H03K 19/0185
 USPC ........... 327/108, 109, 110, 111, 112; 326/30, 326/82, 83
 See application file for complete search history.

(56) References Cited

U.S. PATENT DOCUMENTS

| | | | | |
|---|---|---|---|---|
| 6,628,150 B1* | 9/2003 | Carvajal | ............... | H03K 19/013 327/108 |
| 6,661,288 B2* | 12/2003 | Morgan | ............... | H03F 3/45659 330/258 |
| 6,788,116 B1* | 9/2004 | Cook | ................... | H04L 25/0272 326/82 |
| 6,963,219 B1 | 11/2005 | Ghia et al. | | |
| 7,030,656 B2 | 4/2006 | Lo et al. | | |
| 7,038,502 B2* | 5/2006 | Yamaguchi | ........... | H04L 25/029 326/30 |
| 7,772,725 B2 | 8/2010 | Siman-Tow | | |
| 2007/0103205 A1 | 5/2007 | Whetsel | | |
| 2007/0139080 A1 | 6/2007 | Tang | | |
| 2015/0188537 A1* | 7/2015 | Isoda | ................. | H03K 19/0185 327/108 |

\* cited by examiner

*Primary Examiner* — John Poos

(57) ABSTRACT

A low voltage differential signaling generating circuit, which comprises a current source a pair of output nodes for providing a differential signal by virtue of a voltage difference therebetween, first and second differential switch circuitries and a bypass circuitry. The first differential switch circuitry selectively connects the current source to the first output node based on a control signal to cause a current flow from the first output node to the second one. The second differential switch circuitry selectively connects the current source to the second output node based on the control signal to cause a current flow from the second output node to the first one. The bypass circuitry is arranged in parallel to the first and second differential switch circuitries and is selectively switched based on an idle mode signal to prevent a current between the output nodes.

17 Claims, 3 Drawing Sheets

400

| | SEND "1" | SEND "0" | IDLE |
|---|---|---|---|
| PG1 | 0 | 1 | 1 |
| NG1 | 0 | 1 | 0 |
| PG2 | 1 | 0 | 1 |
| NG2 | 1 | 0 | 0 |
| PG3 | 1 | 1 | 0 |
| NG3 | 0 | 0 | 1 |
| NG4/NG5 | 1 | 1 | 0 |
| OUT+ | HI | LO | Z |
| OUT- | LO | HI | Z |

FIG. 4

LVDS WITH IDLE STATE

BACKGROUND

1. Field

This disclosure relates generally to semiconductor devices, and more specifically, to low voltage differential signaling transmitter capable of operating in a standby state.

2. Related Art

Start-up time for a traditional Low Voltage Differential Signaling (LVDS) circuit is dominated by the settling time of a common mode feedback amplifier. In a traditional LVDS circuit, disabling the output devices removes the common mode voltage, which in turn causes the output of the common mode feedback amplifier to be indeterminate. The time required to re-establish a stable common mode voltage after enabling of the output devices ultimately defines the startup time, which is normally much longer than the standard data transmit time. For example, the settling time of the amplifier may be approximately 500 nanoseconds, but a specification for the LVDS may require the device to be capable of operating within a much shorter time frame, such as 7 nanoseconds after start-up.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 4 is a logic table showing signal states during operation of the serial I/O interface of FIG. 3.

DETAILED DESCRIPTION

Figure 1:
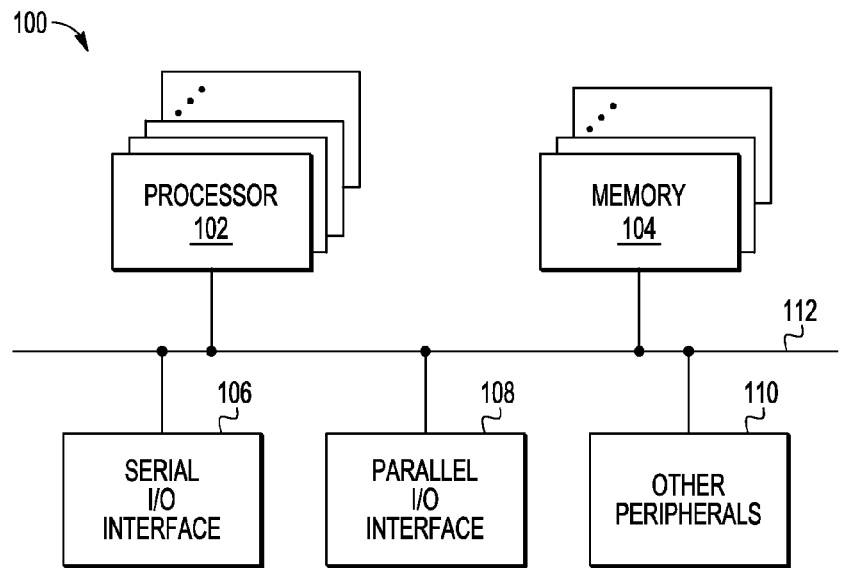
FIG. 1 is a block diagram of an embodiment of a processing system in accordance with the present invention.

Embodiments of systems, devices and methods are disclosed for a low voltage signaling (LVDS) transmitter with a standby or idle current path in the output switching stage of the LVDS circuit. When common lines are used to transmit and receive data between devices, the transmitter does not need to be fully shut down during receive mode, but rather can enter the idle or standby mode. The standby current path maintains voltage at a common mode feedback amplifier during the idle mode, and allows the current sources and feedback amplifier to operate normally while being isolated from the data path of the transmitter. The standby current path further allows the output to be in a high impedance state for receiver functionality. Maintaining the transmitter in standby mode during receiver operation sharply reduces startup delay of the transmitter when switching back to transmit mode. For example, by allowing the transmitter to remain in standby mode, the time required to switch from receive to transmit mode can be reduced from approximately 500 ns to 5 ns. This circuit topology of the transmitter can be re-used in multiple LVDS applications independent of specific standards. Further, the circuit topology can be implemented in any semiconductor technology process node such as CMOS090, CMOS055, CMOS028, etc FIG. 1 is a block diagram of an embodiment of a computer processing system 100 in accordance with the present invention. In the illustrated embodiment, components in computer processing system 100 include processor 102, memory 104, serial input/output (I/O) interface 106, parallel I/O interface 108, and other peripheral devices or modules 110 which are bi-directionally coupled to bus 112 to allow communication between components.

Bus 112 may communicate external to computer processing system 100. Alternate embodiments of the present disclosure may use more, less, or different components and functional blocks that those illustrated in FIG. 1. As some possible examples, alternate embodiments of computer processing system 100 may include a timer, a serial peripheral interface, a digital-to-analog converter, an analog-to digital converter, a driver (e.g. a liquid crystal display driver), and/or a plurality of types of memory.

Serial I/O interface 106 and parallel I/O interface 108 can transmit data to and receive data from devices and/or processing systems external to processing system 100. The external devices or processing systems may be formed on the same substrate as processing system 100, or on another substrate that is connected by a conductive trace on a printed circuit board, a cable, a wirebond or other suitable connection to processing system 100.

Figure 2:
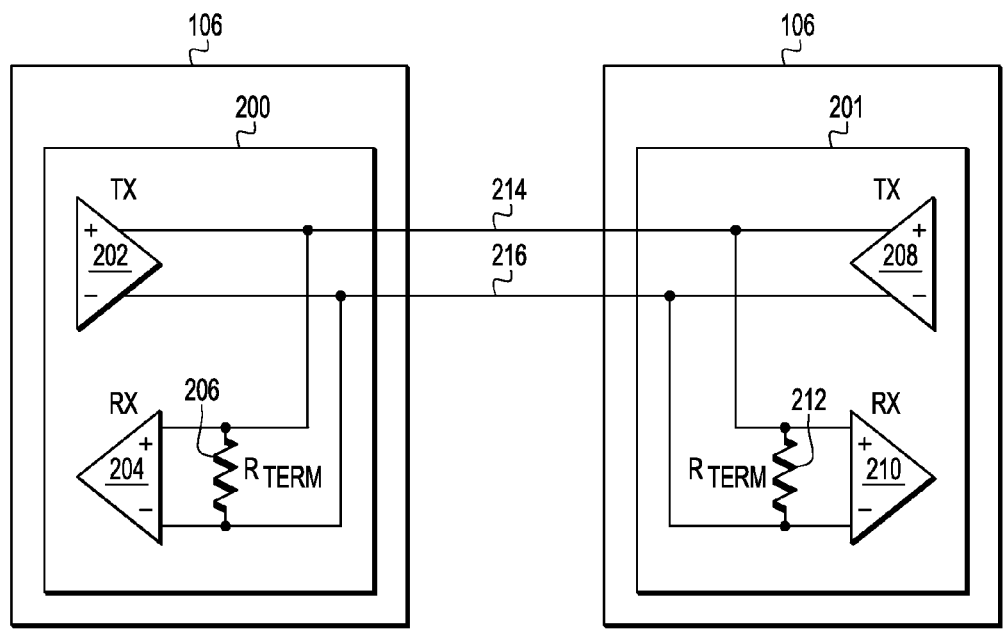
FIG. 2 is a schematic diagram of an embodiment of low voltage differential signaling (LVDS) transceivers that can be used in the processing system of FIG. 1.

FIG. 2 is a schematic diagram of an embodiment of low voltage differential signaling (LVDS) transceivers 200, 201 that can be used in serial I/O interface 106 (and/or parallel I/O interface 108) in the processing system 100 of FIG. 1. Transceiver 200 includes transmitter 202 and receiver 206. Transceiver 201 includes transmitter 208 and receiver 210. The components in transceivers 200, 201 are similar, but are given different reference numbers to facilitate describing the connections between the components. Transceiver 200 can be included in a first processing system 100, and transceiver 201 can be included in another processing system 100. Note that in other implementations, transceivers 200, 201 can be coupled to communicate with one another in the same processing system 100.

Transmitter 202 has two output terminals, with each terminal coupled by respective conductive traces or paths 214, 216 to a respective one of two output terminals of transmitter 208. Receivers 204, 210 each have two input terminals, with a first input terminal of each receiver 204, 210 coupled to a respective one of conductive paths 214, 216. Receiver 204 is thus coupled to receive data from transmitter 208 and receiver 210 is coupled to receive data from transmitter 202.

Terminal resistors 206, 212 are coupled in parallel between respective input terminals of receivers 204, 210. Terminal resistors 206, 212 provide a load that generates voltage at the input terminals of receivers 204, 210 when current flows from a respective one of transmitters 202, 208.

Since transmitters 202, 208 share conductive paths 214, 216 with receivers 204, 210, transmitters 202, 208 include bypass circuitry (not shown) that is used to place transmitters 202, 208 in idle or standby mode when receivers 204, 210 are operating. Transmitters 202, 208 can then disable the bypass circuitry and begin transmitting without waiting for a common mode feedback amplifier (not shown) in transmitters 202, 208 to settle.

Figure 3:
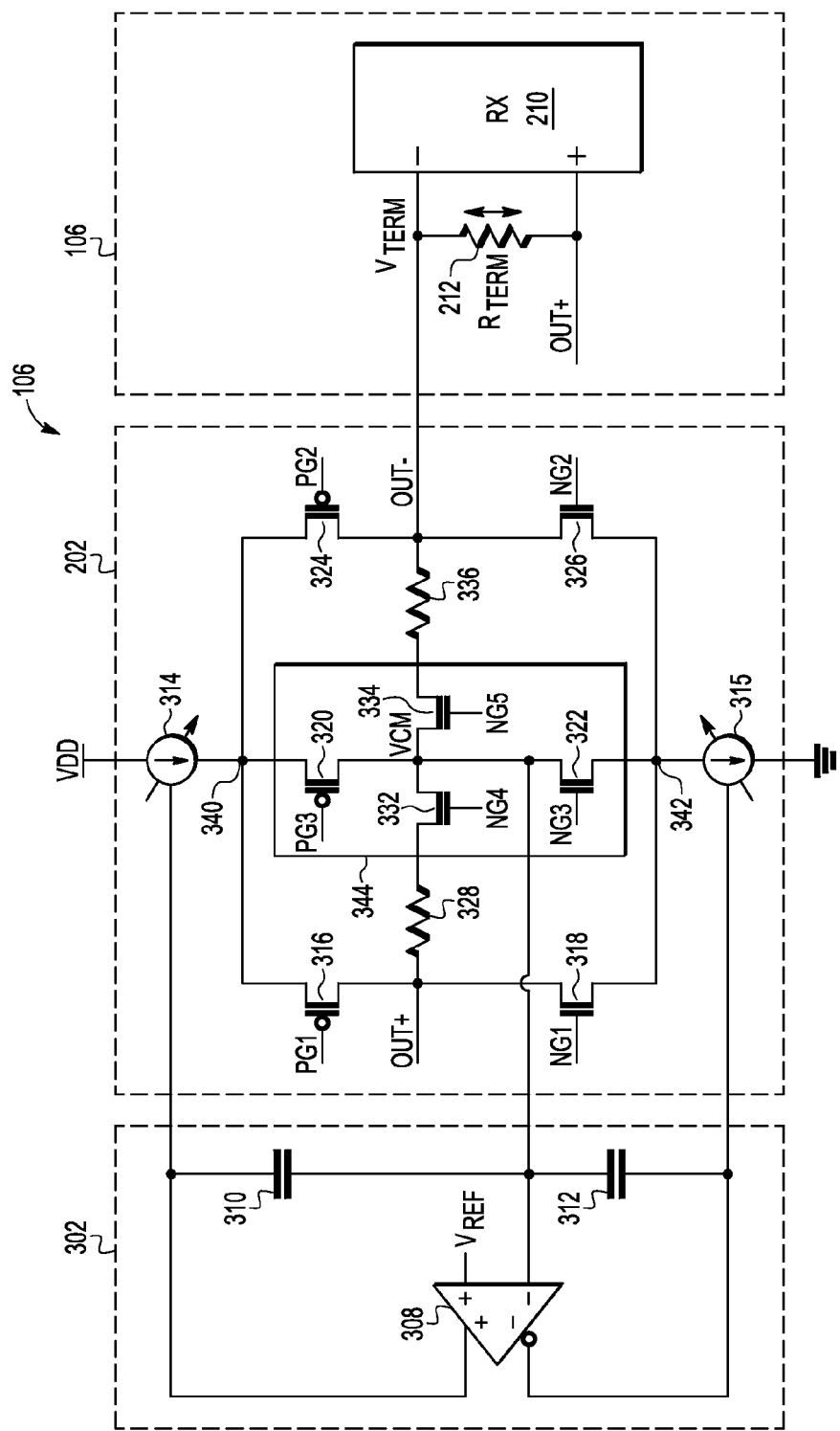
FIG. 3 is a schematic diagram showing an embodiment of a serial I/O interface that can be used in the processing system of FIG. 1.

FIG. 3 is a schematic diagram showing further detail of an embodiment of a serial I/O interface 106 that can be used in the processing system 100 of FIG. 1. Transmitter 202 of serial I/O interface 106 is coupled to common mode feedback amplifier 302, also referred to as feedback circuitry 302, and is further coupled to communicate with receiver 210 in another serial I/O interface 106. Transmitter 202 includes current source 314, current sink 315, P-channel transistors 316, 320, 324, N-channel transistors 318, 322, 326, 332, 334, and resistors 328, 336. An input terminal of current source 314 is coupled to supply voltage VDD. Current source 314 is adjustable to provide to a desired level of current to transmitter 202. Source electrodes of P-channel transistors 316, 320, 324 are coupled to an output terminal of current source 314 at node 340. Source electrodes of N-channel transistors 318, 322, 326 are coupled to an input terminal of current sink 315 at node 342. Drain electrodes of P-channel transistors 316, 320, 324 are coupled to drain electrodes of N-channel transistors 318, 322, 326. Current sink 315 is adjustable to sink a desired level of current from transmitter 202.

A positive output node (OUT+) is coupled between a drain electrode of P-channel transistor 316 and a drain electrode of N-channel transistor 318. A negative output node (OUT−) is coupled between a drain electrode of P-channel transistor 324 and a drain electrode of N-channel transistor 326. A common mode node VCM is coupled between the drain electrodes of P-channel transistor 320 and N-channel transistor 322.

Drain electrodes of N-channel transistors 332, 334 are coupled common mode node VCM and source electrodes of N-channel transistors 332, 334 are coupled to a first terminal of respective resistors 328, 336. A second terminal of resistor 328 is coupled to positive output node OUT+ and a second terminal of resistor 336 is coupled to negative output node OUT−.

Common mode feedback amplifier 302 includes differential amplifier 308 and capacitors 310, 312. A positive input terminal of amplifier 308 is coupled to a reference voltage VREF and a negating input terminal of amplifier 308 is coupled to common mode node VCM. A first output terminal of amplifier 308 is coupled to current source 314 and a second output terminal of amplifier 308 is coupled to current sink 315. Capacitor 310 is coupled between the first output terminal of amplifier 308 and common mode node VCM. Capacitor is coupled between the second output terminal of amplifier 308 and common mode node VCM.

A negating input terminal of receiver 210 is coupled to negative output node OUT− of transmitter 202 and a positive input terminal of receiver 210 is coupled to positive output node OUT+ of transmitter 202. Terminal resistor 212 is coupled between the negating and positive input terminals of receiver 210.

P-channel transistor 320 and N-channel transistor 322 along with transistors 332, 334 form bypass circuit 344 that is activated during an idle or standby mode. When bypass circuit 344 is activated, positive and negative output nodes (OUT+ and OUT−) are at a high impedance state. When transmitter 202 is in transmit mode, bypass circuit 344 is deactivated, allowing LVDS transmitter to operate normally.

Note that transmitter 202 can be implemented using other suitable switching elements instead of or in addition to transistors 316-326, 332, and 334.

Operation of serial I/O interface 106 is described with reference to FIGS. 3 and 4. FIG. 4 is a logic table showing gate control signal states during operation of the serial I/O interface 106 of FIG. 3. To transmit or send a "1", bypass circuit 344 is deactivated by setting gate control signal PG3 at the gate of P-channel transistor 320 to "1", control signal NG3 at the gate of N-channel transistor 322 to "0", control signal NG4 at the gate of N-channel transistor 332 to "1", and control signal NG5 at the gate of N-channel transistor 334 to "1". Gate control signal PG1 at the gate of P-channel transistor 316 is set to "0", control signal NG1 at the gate of N-channel transistor 318 is set to "0", gate control signal PG2 at the gate of P-channel transistor 324 is set to "1", and control signal NG2 at the gate of N-channel transistor 326 is set to "1".

The configuration of transmitter 202 set by the control gate signals PG1-PG3 and NG1-NG5 to transmit "1" causes a HIGH or "1" state at positive output node OUT+ and a LOW or "0" state at negative output node OUT−. Current flows through terminal resistor RTERM from the positive output node OUT+ to the negative output node OUT−, which is read at the input terminals of receiver 210 as a "1".

To transmit or send a "0", bypass circuit 344 is deactivated by setting gate control signal PG3 at the gate of P-channel transistor 320 to "1", control signal NG3 at the gate of N-channel transistor 322 to "0", control signal NG4 at the gate of N-channel transistor 332 to "1", and control signal NG5 at the gate of N-channel transistor 334 to "1". Gate control signal PG1 at the gate of P-channel transistor 316 is set to "1", control signal NG1 at the gate of N-channel transistor 318 is set to "1", gate control signal PG2 at the gate of P-channel transistor 324 is set to "0", and control signal NG2 at the gate of N-channel transistor 326 is set to "0".

The configuration of transmitter 202 set by the control gate signals PG1-PG3 and NG1-NG5 to transmit "0" causes a HIGH or "1" state at negative output node OUT- and a LOW or "0" state at positive output node OUT+. Current flows through terminal resistor RTERM from the negative output node OUT- to the positive output node OUT+, which is read at the input terminals of receiver 210 as a "0".

During the idle or bypass mode, bypass circuit 344 is activated by setting gate control signal PG3 at the gate of P-channel transistor 320 to "0", control signal NG3 at the gate of N-channel transistor 322 to "1", control signal NG4 at the gate of N-channel transistor 332 to "0", and control signal NG5 at the gate of N-channel transistor 334 to "0". Gate control signal PG1 at the gate of P-channel transistor 316 is set to "1", control signal NG1 at the gate of N-channel transistor 318 is set to "0", gate control signal PG2 at the gate of P-channel transistor 324 is set to "1", and control signal NG2 at the gate of N-channel transistor 326 is set to "0".

The configuration of transmitter 202 set by the control gate signals PG1-PG3 and NG1-NG5 to activate bypass circuit 344 during an idle or standby mode provides a continuous common mode voltage to common mode feedback amplifier 302 even after switches or transistors 316, 318, 324 326 are placed in an inactive state. The ability to transmit and receive on the same conductive paths 214, 216 reduces pin count and saves space on the device. Bypass circuit 344 allows amplifier 302 to remain ready for operation even when transceiver 200, 201 is in receive mode, thereby improving bandwidth since little or no time is required to allow amplifier 302 to settle upon entering the transmit mode.

Instead of or in addition to configurations where the LVDS topology of switches 316, 318, 324, 326 in combination with bypass circuit 344 is used in transceivers 200, 201, transmitter 202, 208 can be used in configurations that include two or more transmitters with outputs tied to the same conductive paths 214, 216. In such configurations, transmitter 202, 208 can be placed in idle or standby mode while one of the other transmitters transmits data over the shared conductive paths 214, 216.

By now it should be appreciated that in some embodiments, there has been provided a low voltage differential signaling generating circuit that can include at least one current source (314, 315), a pair of output nodes (OUT+, OUT) for providing a differential signal by virtue of a voltage difference between the pair of output nodes (OUT+, OUT−), a first differential switch circuitry configured to be switched based on a control signal to selectively connect the current source (314, 315) to a first one (OUT+) of the pair of output nodes (OUT+, OUT−) to cause a current flow from the first output note (OUT+) to the second output node (OUT−), a second differential switch circuitry configured to be switched based on the control signal to selectively connect the current source (314, 315) to the second output node (OUT−) to cause a current flow from the second output note (OUT−) to the first output node (OUT+), and bypass circuitry arranged in parallel to the first and second differential switch circuitries and configured to be selectively switched based on an idle mode signal to prevent a current between the pair of output nodes (OUT+, OUT−).

In another aspect, the circuit can further comprise a feedback circuitry (302) configured to generate a control signal for adjusting the current flow supplied by the at least one current source on the basis of a voltage at the bypass circuitry. The at least one current source (314, 315) can be configured to adjust the current flow supplied thereof in accordance with the control signal.

In another aspect, the feedback circuitry (302) can be further configured to generate the control signal for adjusting the current flow supplied by the at least one current source on the basis of an average voltage of voltages at the first and second output nodes (OUT+, OUT−).

In another aspect, the circuit can further comprise a first current source (314), which is arranged upstream the circuitries; and a second current source (315), which is arranged downstream the circuitries. The first and the second current source (314, 315) are configured to adjust the current flow supplied thereof in accordance with the control signal.

In another aspect, the pair of output nodes (OUT+, OUT−) can be coupled resistively to each other and the average voltage of the voltages at the first and second output nodes (OUT+, OUT−) is tapped at the resistive coupling (328, 336) thereof.

In another aspect, the first and the second differential switch circuitries can have a common supply input node (340), which is connected to the current source (314), and a common supply output node (342), and comprise the pair of output nodes (OUT+, OUT−). The first differential switch circuitry can further comprise a first switching element (316) and a second switching element (326). The first switching element (316) can be arranged upstream the pair of output nodes (OUT+, OUT−). The second switching element (326) can be arranged downstream the pair of output nodes (OUT+, OUT−). The second differential switch circuitry can further comprise a third switching element (324) and a fourth switching element (318). The third switching element (324) can be arranged upstream the pair of output nodes (OUT+, OUT−). The fourth switching element (318) can be arranged downstream the pair of output nodes (OUT+, OUT−).

In another aspect, when the first differential switch circuitry switches to connect the current source (314, 315) to the first output node (OUT+), the first and second switching elements (316, 326) are operated in conductive (closed) state and the third and fourth switching elements (324, 318) are operated in nonconductive (open) state. When the second differential switch circuitry switched to connect the current source (314, 315) to the second output node (OUT−), the third and fourth switching elements (324, 318) are operated in conductive (closed) state and the first and second switching elements (316, 326) are operated in nonconductive (open) state.

In another aspect, the bypass circuitry can be interconnected between the common supply input node (340) and the common supply output node (342). The bypass circuitry can further comprise at least one switching element (320, 322).

In another aspect, when one of the first and the second differential switch circuitries is switched to connect the current source (314, 315) to one of the first and the second output nodes (OUT+, OUT−), the at least one switching element (320, 322) can be operated in nonconductive (open) state. When the bypass circuitry is switched to prevent a current between the pair of output nodes (OUT+, OUT−), the at least one switching element (320, 322) can be operated in conductive (closed) state and the first to fourth switching elements (316, 318) of the differential switch circuitries are operated in nonconductive (open) state.

In another aspect, the pair of output nodes (OUT+, OUT−) can be resistively coupled to each other. The resistive coupling and the bypass circuitry can have a common connection point (VCM).

In another aspect, the resistive coupling of the pair of output nodes (OUT+, OUT−) can comprise two switching elements (332, 334), one of which is arranged upstream and the other one of which is arranged downstream to the common connection point (VCM).

In another aspect, one or more of the switching elements are transistors, and each of the transistors is one of a pMOS transistor or an nMOS transistor.

In another aspect, the control signal can be a complementary control signal (PG1, PG2, NG1, NG2).

In another aspect, the first differential switch circuitry and the second differential switch circuitry can form an H-bridge circuitry.

In another aspect, the low voltage differential signaling generating circuit (202) can be provided to generate differential communication signals for signal communication on a communication line having at least two wires. A receiver is configured to receive differential communication signals on the communication line when the low voltage differential signaling generating circuit (202) is in idle mode.

In other embodiments, an integrated circuit can comprise at least one current source (314, 315) and a low voltage differential signaling generating circuit (202). The low voltage differential signaling generating circuit can further comprise a pair of output nodes (OUT+, OUT) for providing a differential signal by virtue of a voltage difference between the pair of output nodes (OUT+, OUT−). A first differential switch circuitry can be configured to be switched based on a control signal to selectively connect the current source (314, 315) to a first one (OUT+) of the pair of output nodes (OUT+, OUT−) to cause a current flow from the first output note (OUT+) to the second output node (OUT−). A second differential switch circuitry can be configured to be switched based on the control signal to selectively connect the current source (314, 315) to the second output node (OUT−) to cause a current flow from the second output note (OUT−) to the first output node (OUT+). A bypass circuit can be arranged in parallel to the first and second differential switch circuitries and configured to be selectively switched based on an idle mode signal to prevent a current between the pair of output nodes (OUT+, OUT−).

In another aspect, the integrated circuit can be capable of bi-directional data communication on the basis of differential communication signals on a shared communication medium having at least two wires. The integrated circuit can further comprise a signal transmitter comprising the low voltage differential signaling generating circuit (202) for transmitting differential communication signals on a shared communication medium and a signal receiver for receiving differential communication signals communicated on the shared communication medium.

In another aspect, the signal receiver is configured to be selectively operated when the low voltage differential signaling generating circuit (202) is in the idle mode.

In yet another embodiment, a method of operating a low voltage differential signaling generating circuit can comprise providing at least one current source (314, 315), and providing a pair of output nodes (OUT+, OUT) for outputting a differential output signal by virtue of a voltage difference between the pair of output nodes (OUT+, OUT−). Based on a control signal, the current source (314, 315) can be selectively connected to a first one (OUT+) of the pair of output nodes (OUT+, OUT−) through a first differential switch circuitries to cause a current flowing from the first output note (OUT+) to the second output node (OUT−). Based on the control signal, the current source (314, 315) can be selectively connected to the second output node (OUT−) through a second differential switch circuitries to cause a current flowing from the second output note (OUT−) to the first output node (OUT+). Based on an idle mode signal, a bypass circuitry arranged in parallel to the first and second differential switch circuitries can be selectively switched to prevent a current flowing between the pair of output nodes (OUT+, OUT−).

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

As used herein, the term "bus" 112 is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Alternatively, system 100 may include any number of separate integrated circuits or separate devices interconnected with each other. For example, memory 104 may be located on a same integrated circuit as processors 102 or on a separate integrated circuit or located within another peripheral or slave discretely separate from other elements of system 100. Serial I/O interface 106, parallel I/O interface 108 and/or other peripherals 110 may also be located on separate integrated circuits or devices. Also for example, system 100 or portions thereof may be soft or code representations of physical circuitry or of logical representations convertible into physical circuitry. As such, system 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, processing system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A low voltage differential signaling generating circuit, comprising:
    at least one current source,
    a pair of output nodes for providing a differential signal by virtue of a voltage difference between the pair of output nodes;
    a first differential switch circuitry configured to be switched based on a control signal to selectively connect the current source to a first one of the pair of output nodes to cause a current flow from the first output note to the second output node;
    a second differential switch circuitry configured to be switched based on the control signal to selectively connect the current source to the second output node to cause a current flow from the second output note to the first output node; and
    a bypass circuitry arranged in parallel to the first and second differential switch circuitries and configured to be selectively switched based on an idle mode signal to prevent a current between the pair of output nodes;
    a feedback circuitry configured to generate a control signal for adjusting the current flow supplied by the at least one current source on the basis of a voltage at the bypass circuitry,
    wherein the at least one current source is configured to adjust the current flow supplied thereof in accordance with the control signal.

2. The circuit according to claim 1,
    wherein the feedback circuitry is further configured to generate the control signal for adjusting the current flow supplied by the at least one current source on the basis of an average voltage of voltages at the first and second output nodes.

3. The circuit according to claim 2, comprising:
    a first current source, which is arranged upstream the circuitries; and
    a second current source, which is arranged downstream the circuitries,
    wherein the first and the second current source is configured to adjust the current flow supplied thereof in accordance with the control signal.

4. The circuit according to claim 2,
    wherein the pair of output nodes are coupled resistively to each other and the average voltage of the voltages at the first and second output nodes is tapped at the resistive coupling thereof.

5. The circuit according to 1,
    wherein the first and the second differential switch circuitries have a common supply input node which is connected to the current source, and a common supply output node, and comprise the pair of output nodes,
    wherein the first differential switch circuitry further comprises a first switching element and a second switching element, wherein the first switching element is arranged upstream the pair of output nodes, wherein the second switching element is arranged downstream the pair of output nodes,
    wherein the second differential switch circuitry further comprises a third switching element and a fourth switching element, wherein the third switching element is arranged upstream the pair of output nodes, wherein the fourth switching element (318) is arranged downstream the pair of output nodes.

6. The circuit according to claim 5,
    wherein when the first differential switch circuitry switches to connect the current source to the first output node, the first and second switching elements are operated in conductive state and the third and fourth switching elements are operated in nonconductive state,
    wherein when the second differential switch circuitry switches to connect the current source to the second output node, the third and fourth switching elements are operated in conductive (closed) state and the first and second switching elements are operated in nonconductive (open) state.

7. The circuit according to claim 6,
    wherein the bypass circuitry is interconnected between the common supply input node and the common supply output node,
    wherein the bypass circuitry further comprises at least one switching element.

8. The circuit according to claim 7,
    wherein when one of the first and the second differential switch circuitries is switched to connect the current source to one of the first and the second output nodes, the at least one switching element is operated in nonconductive state,
    when the bypass circuitry is switched to prevent a current between the pair of output nodes, the at least one switching element is operated in conductive state and the first to fourth switching elements of the differential switch circuitries are operated in nonconductive state.

9. The circuit according to claim 7,
    wherein the pair of output nodes are resistively coupled to each other,
    wherein the resistive coupling and the bypass circuitry have a common connection point.

10. The circuit according to claim 9, wherein
    the resistive coupling of the pair of output nodes comprises two switching elements, one of which is arranged upstream and the other one of which is arranged downstream to the common connection point.

11. The circuit according to claim 10, wherein one or more of the switching elements are transistors, wherein each of the transistors is one of a pMOS transistor or an nMOS transistor.

12. The circuit according to claim 1,
wherein the control signal is a complementary control signal.

13. The circuit according to claim 1,
wherein the first differential switch circuitry and the second differential switch circuitry form an H-bridge circuitry.

14. The circuit according to claim 1,
wherein the low voltage differential signaling generating circuit is provided to generate differential communication signals for signal communication on a communication line having at least two wires,
wherein a receiver is configured to receive differential communication signals on the communication line when the low voltage differential signaling generating circuit is in idle mode.

15. An integrated circuit, comprising:
at least one current source and a low voltage differential signaling generating circuit,
wherein the low voltage differential signaling generating circuit further comprises:
  a pair of output nodes for providing a differential signal by virtue of a voltage difference between the pair of output nodes;
  a first differential switch circuitry configured to be switched based on a control signal to selectively connect the current source to a first one of the pair of output nodes to cause a current flow from the first output note to the second output node;
  a second differential switch circuitry configured to be switched based on the control signal to selectively connect the current source to the second output node to cause a current flow from the second output note to the first output node;
  a bypass circuitry arranged in parallel to the first and second differential switch circuitries and configured to be selectively switched based on an idle mode signal to prevent a current between the pair of output nodes;
  a signal transmitter comprising the low voltage differential signaling generating circuit (202) for transmitting differential communication signals on a shared communication medium; and
  a signal receiver for receiving differential communication signals communicated on the shared communication medium, wherein the integrated circuit is capable of bi-directional data communication on the basis of differential communication signals on the shared communication medium having at least two wires.

16. The integrated circuit according claim 15, wherein
the signal receiver is configured to be selectively operated when the low voltage differential signaling generating circuit is in the idle mode.

17. Method of operating a low voltage differential signaling generating circuit, comprising:
providing at least one current source,
providing a pair of output nodes for outputting a differential output signal by virtue of a voltage difference between the pair of output nodes;
based on a control signal, selectively connecting the current source to a first one of the pair of output nodes through a first differential switch circuitries to cause a current flowing from the first output note to the second output node;
based on the control signal, selectively connecting the current source to the second output node through a second differential switch circuitries to cause a current flowing from the second output note to the first output node; and
based on an idle mode signal, selectively switching a bypass circuitry arranged in parallel to the first and second differential switch circuitries to prevent a current flowing between the pair of output nodes;
generating a control signal for adjusting the current flow supplied by the at least one current source on the basis of a voltage at the bypass circuitry in feedback circuitry,
wherein the at least one current source is configured to adjust the current flow supplied thereof in accordance with the control signal.

* * * * *